United States Patent
Toprac et al.

(12) 
(10) Patent No.: US 6,607,926 B1
(45) Date of Patent: Aug. 19, 2003

(54) METHOD AND APPARATUS FOR PERFORMING RUN-TO-RUN CONTROL IN A BATCH MANUFACTURING ENVIRONMENT

(75) Inventors: Anthony J. Toprac, Austin, TX (US); William J. Campbell, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/371,665

(22) Filed: Aug. 10, 1999

(51) Int. Cl.$^7$ .......................... H01L 21/00; G06F 19/00
(52) U.S. Cl. .............................. 438/7; 702/84
(58) Field of Search ................. 438/5, 7, 8, 9, 438/14, 16, 401; 250/492.22; 700/121; 702/81, 82, 83, 84

(56) References Cited

U.S. PATENT DOCUMENTS

| | | | |
|---|---|---|---|
| 5,105,362 A | 4/1992 | Kotani | 364/468 |
| 5,741,732 A | 4/1998 | Tikhonov | 438/149 |
| 5,866,437 A | 2/1999 | Chen et al. | 438/14 |

FOREIGN PATENT DOCUMENTS

DE 19652741 A1 12/1996 ......... H01L/21/316

OTHER PUBLICATIONS

Hu et al., "Concurrent Deployment of Run by Run Controller Using SCC Framework," *1993 IEEE/SEMI Int'l Semiconductor Mfg. Science Symposium,* pp. 126–132, Jul. 19, 1993.

*Primary Examiner*—Evan Pert
(74) *Attorney, Agent, or Firm*—Williams, Morgan & Amerson, P.C.

(57) ABSTRACT

The present invention provides for a method and an apparatus for controlling manufacturing processes using a hierarchical system. A first lot of semiconductor devices is processed using a first set of control input parameters. The first set of control input parameters is stored in one of a plurality of hierarchical levels, the first set of control input parameters being available for processing of a second lot of semiconductor devices. Process data is acquired from the processing of the first lot of semiconductor devices. A second set of control input parameters is determined for a subsequent lot of semiconductor devices based upon the acquired process data. The second set of control input parameters is stored in one of a plurality of hierarchical levels, the first and second sets of control input settings being available for processing of a third lot of semiconductor devices.

27 Claims, 11 Drawing Sheets

| Stepper A | | | | | | | | | Stepper B 604 | | | | | | | | | Stepper C 606 | | | | | | | | |
|---|---|---|---|---|---|---|---|---|---|---|---|---|---|---|---|---|---|---|---|---|---|---|---|---|---|---|
| A 608 | | | B 610 | | | C 612 | | | A 614 | | | B 616 | | | C 618 | | | A 620 | | | B 622 | | | C 624 | | |
| 1 | 2 | 3 | 1 | 2 | 3 | 1 | 2 | 3 | 1 | 2 | 3 | 1 | 2 | 3 | 1 | 2 | 3 | 1 | 2 | 3 | 1 | 2 | 3 | 1 | 2 | 3 |
| 626 | 628 | 630 | 632 | 634 | 636 | 638 | 640 | 642 | 644 | 646 | 648 | 650 | 652 | 654 | 656 | 658 | 660 | 662 | 664 | 666 | 668 | 670 | 672 | 674 | 676 | 678 |

| | Stepper A | | | | | | Stepper B | | | | | | | | | Stepper C | | | | | | | |
|---|---|---|---|---|---|---|---|---|---|---|---|---|---|---|---|---|---|---|---|---|---|---|---|
| 1st | 602 | | | | | | 604 | | | | | | | | | 606 | | | | | | | |
| 2nd | A 608 | | | B 610 | | | C 612 | | | A 614 | | | B 616 | | | C 618 | | | A 620 | | | B 622 | | | C 624 | | |
| 3rd | 1 626 | 2 628 | 3 630 | 1 632 | 2 634 | 3 636 | 1 638 | 2 640 | 3 642 | 1 644 | 2 646 | 3 648 | 1 650 | 2 652 | 3 654 | 1 656 | 2 658 | 3 660 | 1 662 | 2 664 | 3 666 | 1 668 | 2 670 | 3 672 | 1 674 | 2 676 | 3 678 |

| Stepper A | | | | | | | | | Stepper B | | | | | | | | | Stepper C | | | | | | | | |
|---|---|---|---|---|---|---|---|---|---|---|---|---|---|---|---|---|---|---|---|---|---|---|---|---|---|---|
| 602 | | | | | | | | | 604 | | | | | | | | | 606 | | | | | | | | |
| A 608 | | | B 610 | | | C 612 | | | A 614 | | | B 616 | | | C 618 | | | A 620 | | | B 622 | | | C 624 | | |
| 1 | 2 | 3 | 1 | 2 | 3 | 1 | 2 | 3 | 1 | 2 | 3 | 1 | 2 | 3 | 1 | 2 | 3 | 1 | 2 | 3 | 1 | 2 | 3 | 1 | 2 | 3 |
| 626 | 628 | 630 | 632 | 634 | 636 | 638 | 640 | 642 | 644 | 646 | 648 | 650 | 652 | 654 | 656 | 658 | 660 | 662 | 664 | 666 | 668 | 670 | 672 | 674 | 676 | 678 |

METHOD AND APPARATUS FOR PERFORMING RUN-TO-RUN CONTROL IN A BATCH MANUFACTURING ENVIRONMENT

BACKGROUND OF THE INVENTION

1. Field of the Invention

This invention relates generally to semiconductor products manufacturing, and, more particularly, to a method and means for hierarchical organization of run-to-run control parameters.

2. Description of the Related Art

The technology explosion in the manufacturing industry has resulted in many new and innovative manufacturing processes. Todays manufacturing processes, particularly semiconductor manufacturing processes, call for a large number of important steps. These process steps are usually vital, and, therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and so specialized that the processes may be performed in different manufacturing locations that contain different control schemes.

One of the most important aspects of semiconductor manufacturing is overlay control. Overlay is one of several important steps in the lithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for the reduction of misalignment errors increases dramatically.

Generally, photolithography engineers currently analyze the overlay errors a few times a month. The results from the analysis of the overlay errors are used to manually make updates to control settings. Some of the problems associated with the current methods include the fact that the control settings such as ASM settings for photolithography processes, are only updated a few times a month. Furthermore, currently, the ASM updates are performed manually.

Generally, a set of processing steps is performed on a lot of wafers on a semiconductor manufacturing tool called a stepper. The stepper communicates with a manufacturing framework or a network of processing modules. The manufacturing framework is connected to an equipment interface. The equipment interface is connected to a machine interface to which the stepper is connected, thereby facilitating communications between the stepper and the manufacturing framework. The machine interface interacts with an automatic process control (APC) system. The APC system initiates a control script, which can be a computer program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner.

The present invention is directed to overcoming, or at least reducing the effects of, one or more of the problems set forth above.

SUMMARY OF THE INVENTION

In one aspect of the present invention, a method is provided for controlling manufacturing processes using a hierarchical system. A first lot of semiconductor devices is processed using a first set of control input parameters. The first set of control input parameters is stored in one of a plurality of hierarchical levels, the first set of control input parameters being available for processing of a second lot of semiconductor devices. Process data is acquired from the processing of the first lot of semiconductor devices. A second set of control input parameters is determined for a subsequent lot of semiconductor devices based upon the acquired process data. The second set of control input parameters is stored in one of a plurality of hierarchical levels, the first and second sets of control input parameters being available for processing of a third lot of semiconductor devices.

In another aspect of the present invention, an apparatus is provided for controlling manufacturing processes using a hierarchical system. The apparatus of the present invention comprises means for processing a first lot of semiconductor devices using a first set of control input parameters, means for storing the first set of control input parameters in one of a plurality of hierarchical levels, the first set of control input parameters being available for processing of a second lot of semiconductor devices, means for acquiring process data from the processing of the first lot of semiconductor devices, means for determining a second set of control input parameters for a subsequent lot of semiconductor devices based upon the acquired process data, and means for storing the second set of control input parameters in one of a plurality of hierarchical levels, the first and second sets of control input parameters being available for processing of a third lot of semiconductor devices.

BRIEF DESCRIPTION OF THE DRAWINGS

The invention may be understood by reference to the following description taken in conjunction with the accompanying drawings, in which like reference numerals identify like elements, and in which:

FIG. 6 illustrates a graphical depiction of one embodiment of the hierarchical levels described in the present invention;

FIG. 7 illustrates an example of the implementation of the hierarchical system based upon the results of processing a first semiconductor lot;

FIG. 8 illustrates an example of the implementation of the hierarchical system based upon the results of processing a second semiconductor lot;

FIG. 9 illustrates an example of the implementation of the hierarchical system based upon the results of processing a third semiconductor lot;

FIG. 10 illustrates an example of the implementation of the hierarchical system based upon the results of processing a fourth semiconductor lot; and FIG. 11 illustrates an example of the implementation of the hierarchical system based upon the results of processing a fifth semiconductor lot.

Figure 1:
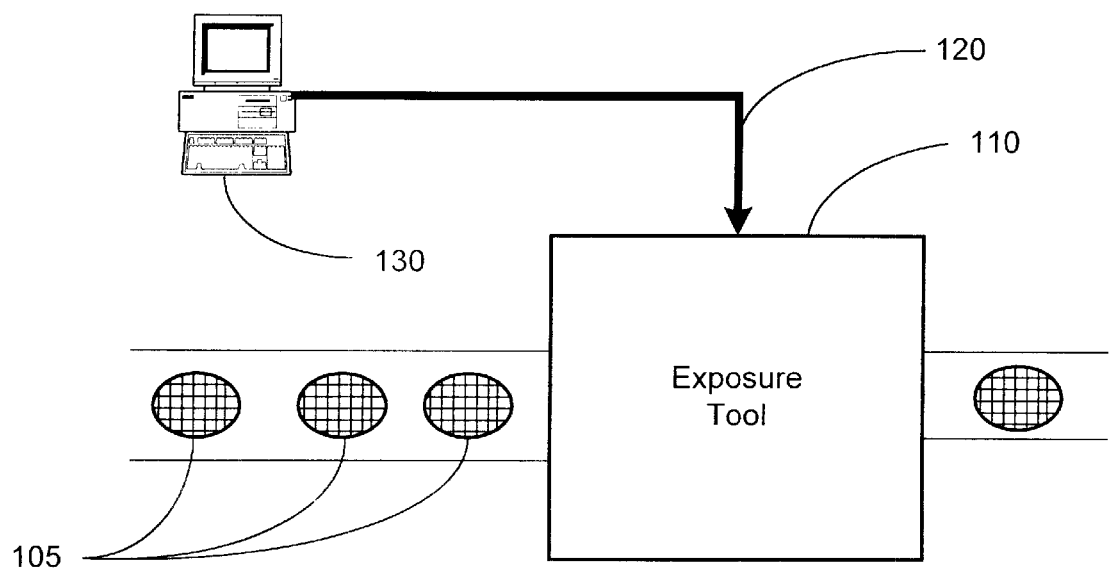
FIG. 1 illustrates semiconductor wafers being processed on an semiconductor manufacturing tool using a plurality of control input signals.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. One process in semiconductor manufacturing is the overlay process. In particular, the overlay process involves measuring misalignment errors between semiconductor layers during manufacturing processes. Improvements in semiconductor manufacturing processes, such as the overlay process, could result in substantial enhancements, in terms of quality and efficiency, in manufacturing of semiconductor devices. The present invention provides a method of implementing automated error correction for control of semiconductor processes, such as the overlay process. Furthermore, the present invention provides a method of performing run-to-run control of semiconductor manufacturing processes.

Semiconductor devices are processed in a manufacturing environment using a number of input control parameters. Turning now to FIG. 1, in one embodiment, semiconductor products 105, such as semiconductor wafers, are processed on an exposure tool 110 using a plurality of control input signals (or control input parameters) on a line 120. In one embodiment, the control input signals on the line 120 are sent to the exposure tool 110 from a computer system 130. One example of an exposure tool 110 used in semiconductor manufacturing processes is a stepper.

The control inputs, on the line 120, that are used to operate the exposure tool 110 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of updating the control input signals described above, on a run-to-run basis.

When a process step in the exposure tool 110 is concluded, the semiconductor wafer that is being processed in the exposure tool 110 is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool.

Once errors are determined from the examination after the run of a lot of wafers, the control inputs on the line 120 are modified for a subsequent run of a lot of semiconductor wafers. Modifying the control signals on the line 120 is designed to improve the next process step in the exposure tool 110. The value of the error corresponding to a control input signal is used to update that control input signal for a subsequent manufacturing process step. One embodiment of the control input signal modification sequence is illustrated in further detail in FIG. 2.

Figure 2:
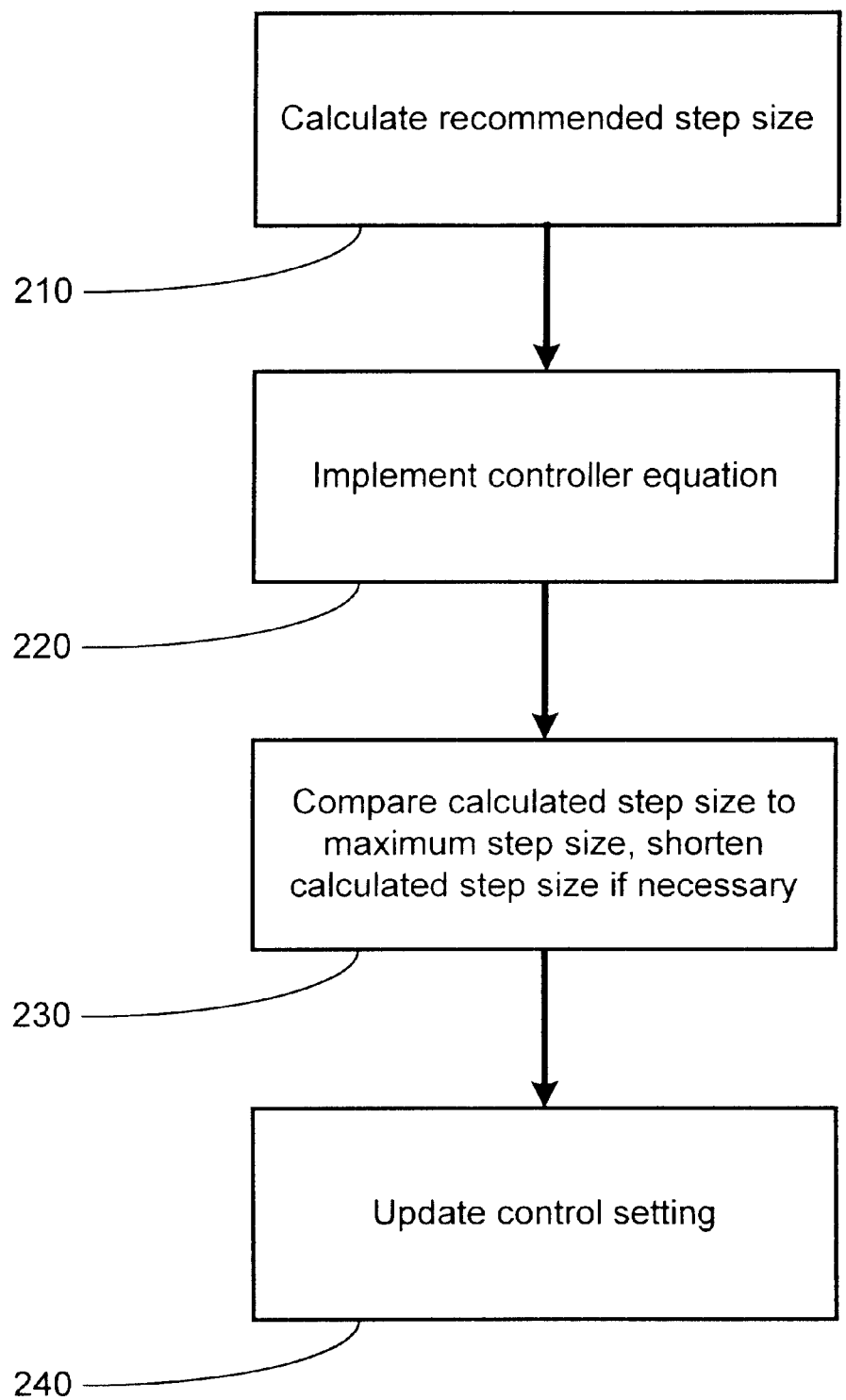
FIG. 2 depicts one embodiment of updating control input parameters of a process.

Turning now to FIG. 2, once the error data associated with a particular control input signal is acquired, a recommended step size of the change in the value of the control input signal is calculated, as described in block 210 of FIG. 2. The step size of the change in the value of the control input signal relates to the change in the magnitude of the value of the control input signal. The magnitude of the value of the control input signal determines the input characteristics of the settings of semiconductor manufacturing tools, such as the exposure tool 110. In one embodiment, the step size, which determines the new settings of the control input signal on line 120, is calculated using Equation 1, as described in block 220 of FIG. 2.

New setting=Old setting−[(weight)*(error value)]     Equation 1

As illustrated in Equation 1, the new setting of the control input signal on the line 120 is calculated by subtracting the magnitude of the old setting of the control input signal by the product of the weight and the error value of the control input signal on the line 120. The weight is a predetermined parameter that is assigned to the error value of a particular control input signal on the line 120. The weight of an error value of a control input signal generally lies between zero and one. The use of the weight of the error value of a control input signal is one method of preventing a controller of a semiconductor manufacturing tool from operating in an inordinately jittery fashion. In other words, the value of the weight can be used to at least partially control the step size of the change of the new setting from the old setting of the control input signal.

Although the value of the weight can be used to partially control the step size of the change in the setting of the control input signal, the value of the weight may still be insufficient to prevent an excessively large step size. In other words, even if an optimum weight were to be assigned to a particular error signal, a calculated step size of a change in the setting of a control input signal may be too large, such that it could cause a controller of a semiconductor manufacturing tool to perform in an excessively jittery fashion. Therefore, the calculated step size is compared to a predetermined maximum step size that is allowable for the change in setting of a control input signal in the line 120, as described in block 230 of FIG. 2.

When a determination is made that the calculated step size of the change in the magnitude of the control input signal is smaller than the predetermined maximum step size, the calculated step size is used to compute the new settings of the control input signal. When a determination is made that the calculated step size of the change in the magnitude of the control input signal is larger than the predetermined maximum step size, the predetermined maximum step size is used to compute the new settings of the control input signal. Based upon the calculation of the step size of the new settings of the control input signal on the line 120, the control input signal is updated for the next manufacturing process step, as described in block 240 of FIG. 2.

The completion of the step described in block 240 concludes the step of implementing the control input modification sequence. New error data for other control input signals are acquired and corrected using the steps described above. Once the relevant control input signals for a semiconductor manufacturing tool are updated, the control input signals with new, more accurate settings are used to perform a semiconductor manufacturing process step for a subsequent run of semiconductor devices.

One method of using the updated control input signals on the line 120 is implemented by control threads. The control input signal grouping or threads identifies a batch of lots with similar characteristics. Control threads can be implemented by a number of semiconductor process controllers, such as an overlay controller. Control threads are a significant part of the control scheme of a semiconductor manufacturing tool, such as the exposure tool 110. Each of the different control threads acts like a separate controller and is differentiated by various process conditions. For overlay control, the control threads are separated by a combination of different conditions, including the semiconductor manufacturing tool (e.g., stepper) currently processing the wafer lot, the semiconductor product, the semiconductor manufacturing operation, and the semiconductor manufacturing tool that processed the semiconductor wafer lot at a previous layer of the wafer.

The reason for keeping the control threads separate is that different semiconductor manufacturing process conditions affect the overlay error in different fashion. By isolating each of the unique semiconductor manufacturing process conditions into its own corresponding control thread, the overlay error can become a more accurate portrayal of the conditions in which a subsequent semiconductor wafer lot in the control thread will be processed. Since the error measurement is more relevant, changes to the control input signals based upon the error will be more appropriate. The implementation of the control scheme described by the present invention can lead to a reduction in the overlay error.

To illustrate the effectiveness of the control thread arrangement, consider the following example in which stepper operations are discussed. For example, Stepper A produces wafers with a translational error of 0.05 microns, Stepper B has an error of −0.05 microns, and Stepper C has 0.1 microns of error. If a semiconductor wafer lot was processed on Stepper A, then it was processed on Stepper B at the next layer, the overlay error between them would be −0.1 microns. If the lot were processed on Stepper B and Stepper C instead, the error would be 0.15 microns. The error is different depending upon which conditions were present when the lot was processed. Below is a table of the possible error outcomes, given the stepper/stepper pair used in processing.

TABLE 1

ERROR AS A FUNCTION OF STEPPER/STEPPER PAIR

| | Stepper A | Stepper B | Stepper C |
|---|---|---|---|
| Stepper A | 0 | −0.1 | 0.05 |
| Stepper B | 0.1 | 0 | 0.15 |
| Stepper C | −0.05 | −0.15 | 0 |

One of the advantages of the control thread framework is illustrated in this example. There are three possible overlay error values for each of the steppers, depending upon which stepper processed the wafer lot at the last layer. One problem that arises is the controller cannot predict what the error will be for the next semiconductor wafer lot that is processed on the same semiconductor manufacturing tool. Utilizing the control threads, each of the conditions illustrated in Table 1 would have its own controller. Since only one condition would exist for each controller, that controller would be able to predict the error that the next semiconductor wafer lot would encounter and adjust the control input signals accordingly.

Overlay metrology is an important part of any semiconductor manufacturing tool control strategy described above. Review stations, such as KLA review stations are capable of providing the control algorithm that can measure the control error. Each of the error measurements corresponds to one of the control input signals on the line 120, in a direct manner. Before the error can be utilized to correct control input signals, a certain amount of preprocessing is generally completed. This additional complexity is designed to make the error estimates provided by the review stations more accurate.

One of the first steps in the preprocessing, or data manipulation, of control input signals is outlier rejection. Outlier rejection is a gross error check that is employed to ensure that the data that is received is reasonable in light of the historical performance of the semiconductor manufacturing process. This procedure involves comparing each of the overlay errors to its corresponding predetermined boundary parameter. In one embodiment, even if one of the predetermined boundaries is exceeded, the error data from the entire semiconductor wafer lot is generally rejected. To determine the limits of the outlier rejection, thousands of actual semiconductor manufacturing fabrication (fab) data points are collected. The standard deviation for each error parameter in this collection of data is then calculated In one embodiment, for outlier rejection, nine times the standard deviation (both positive and negative) is generally chosen as the predetermined boundary. This was done primarily to ensure that only the points that are significantly outside the normal operating conditions of the process are rejected.

The next stage in the process is to smooth out the data, also known as filtering. This is important because the error measurements are subject to a certain amount of randomness, such that the error significantly deviates in value. Filtering the review station data results in a more accurate assessment of the error in the control input signal settings. In one embodiment, the overlay control scheme utilizes a filtering procedure known as an Exponentially-Weighted Moving Average (EWMA) filter, although other filtering procedures can be utilized in this context. The equation for the EWMA filter is illustrated in Equation 2.

New average=(weight)*(current measurement)+(1−weight)*(previous EWMA average)]  Equation 2

Figure 3:
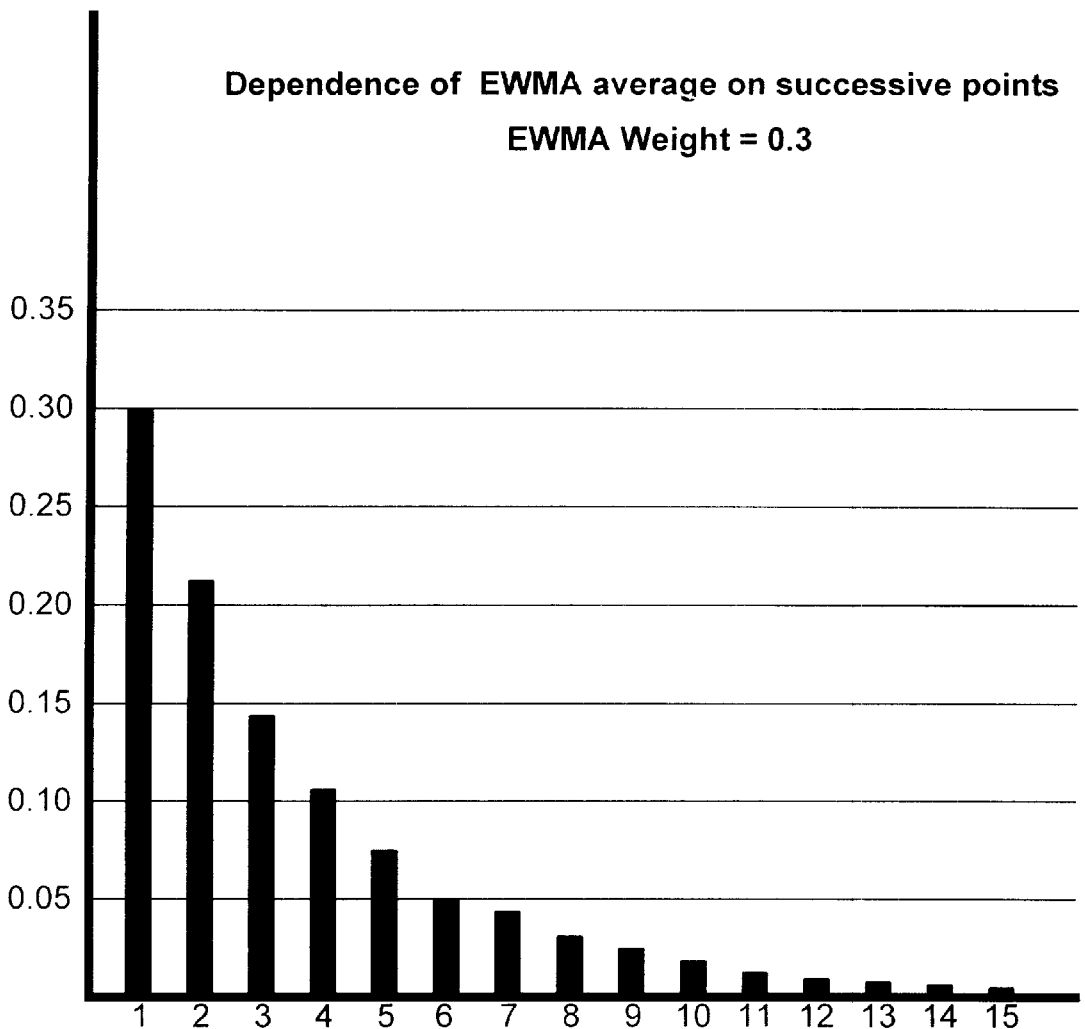
FIG. 3 illustrates the dependence of the average on each successive point in an EWMA filter.

The weight is an adjustable parameter that can be used to control the amount of filtering and is generally between zero and one. The weight represents the confidence in the accuracy of the current data point. If the measurement is considered to be accurate, the weight should be close to one. If there were a significant amount of fluctuations in the process, then a number closer to zero would be appropriate. The new average is calculated from the current measurement, the weight, and the last average calculated. The dependence of the average on each successive point is illustrated in FIG. 3.

In one embodiment, there are at least two methods of utilizing the EWMA filtering process. The first implementation is to use the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second option is to retain only some of the data and calculate the average from the raw data each time.

The manufacturing environment in the semiconductor manufacturing fab presents some unique challenges. The order that the semiconductor wafer lots are processed through a semiconductor manufacturing tool, such as a stepper, may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the control input signal settings.

For the reasons discussed above, and for other considerations, the overlay controller uses limited storage of data to calculate the EWMA filtered error. Semiconductor wafer lot data, including the lot number, the time the lot was processed on the semiconductor manufacturing tool, such as the stepper, and the multiple error estimates, are stored in a data storage (called Data Store in one embodiment) under the control thread name. When a new set of data is collected, the stack of data is retrieved from Data Store and analyzed. The lot number of the current semiconductor wafer lot being processed is compared to those in the stack. If the lot number matches any of the data present there, the error measurements are replaced. Otherwise, the data point is added to the current stack in chronological order, according to the time periods when the lots were processed through the stepper. In one embodiment, any data point within the stack that is over 48 hours old is removed. Once the aforementioned steps are complete, the new filter average is calculated and stored to Data Store.

The present invention teaches a method of hierarchical ordering of the conditions, or attributes, that constitute a control thread. In one embodiment, the hierarchical ordering of control thread data is related to the strength of the effects that these conditions exert on the control of a manufacturing process. One example of hierarchical ordering of control thread follows. The control inputs of the specific tool used at a process may be a major influence on the control inputs of the present process, which can be defined as the first level of a hierarchical ordering of control thread data. The control inputs of the manufacturing tool employed at a previous operation may be the second most influential factor on the control inputs of the present process, which can be defined as the second level of the hierarchical ordering of control thread data. The control inputs relating to a similar product type may be the third most influential factor on the control inputs of the present process, which can be defined as the third level of the hierarchical ordering of control thread data. Further levels of the hierarchical ordering of control thread data can be defined using other similarities between previous processes and a current process.

Generally, a number of discrete process factors will affect the performance of a given manufacturing process. These factors can be arranged in a hierarchy. The different levels in the hierarchy can be arranged in order of the relative impact each of the previous process factors will have on the variance of the present manufacturing process. Each semiconductor lot processed will generally involve a discrete value from each hierarchy, but will contribute process information to multiple hierarchical levels. Control of each semiconductor lot will use the lowest hierarchical level (the second level being lower than the first level) for which there is previous process metrology information. Generally, the processing of each semiconductor lot will add information to each hierarchical level.

Using the aforementioned hierarchical ordering of control thread data, an automatic spawning of control threads can be implemented. In one embodiment, initially, the control inputs for a plurality of semiconductor lots are placed into a single control thread. When sufficient data is present to prove a statistically significant difference between lots belonging to different hierarchical levels, a process controller splits the initial control thread into two control threads. As more data is obtained, new control threads that represent different hierarchical levels are generated.

Figure 4:
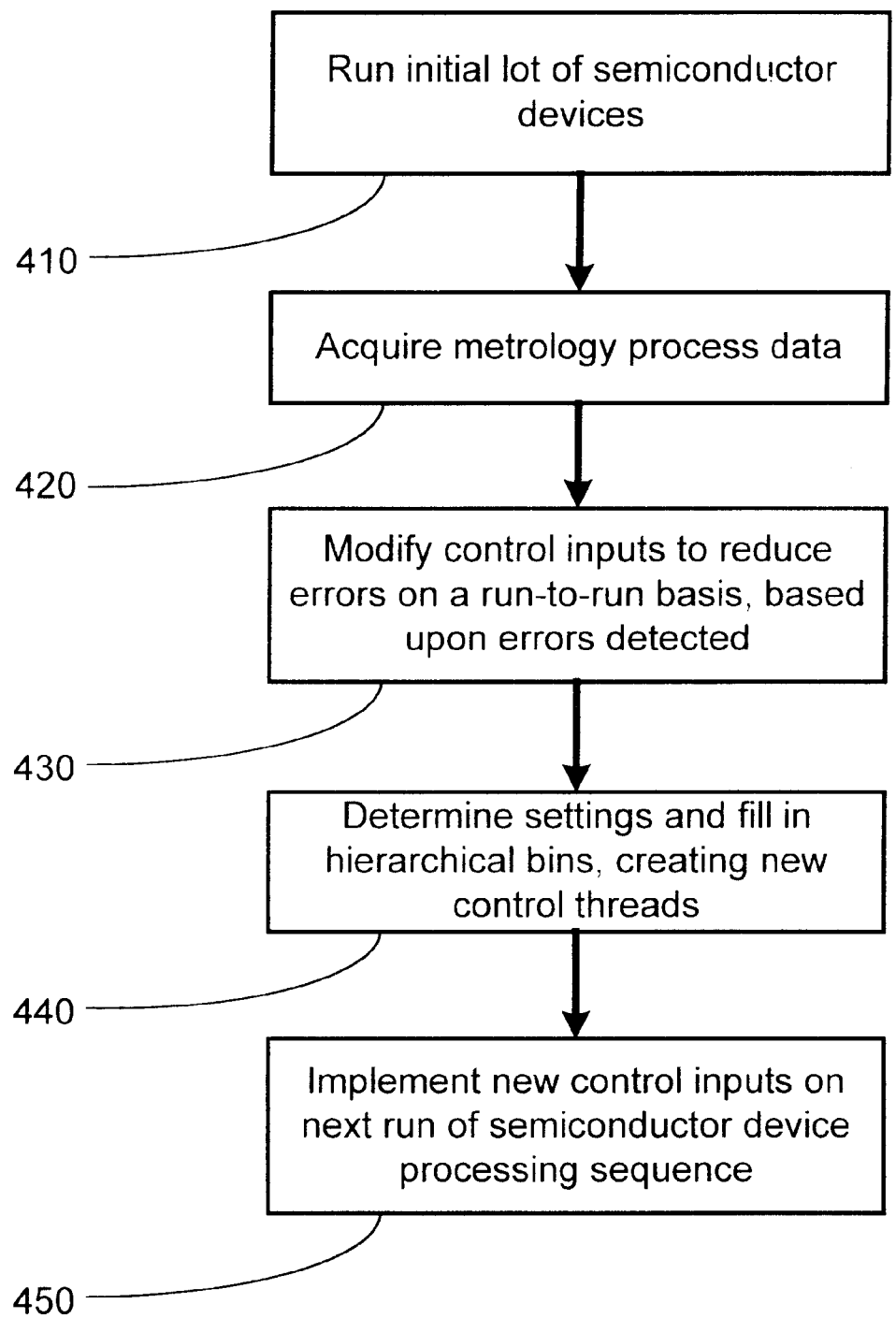
FIG. 4 illustrates one embodiment of the hierarchical method taught by the present invention.

Turning now to FIG. 4, a flowchart representation of the method taught by the present invention is illustrated. In one embodiment, one control thread is used to run a manufacturing process on a lot of semiconductor devices, as described in block 410 of FIG. 4. Metrology process data is then acquired and control input errors are calculated, as described in block 420 of FIG. 4. To improve process performance, the control inputs for the next process run are modified on a run-to-run basis, based upon errors detected from a previous manufacturing run, as described in block 430 of FIG. 4. Based upon the errors detected from the previous manufacturing run, new control input settings are determined and an appropriate bin in a hierarchical level is filled with data, effectively creating new control threads, as described in block 440 of FIG. 4. The step described in block 440 of FIG. 4 is illustrated in further detail in FIG. 5.

Figure 5:
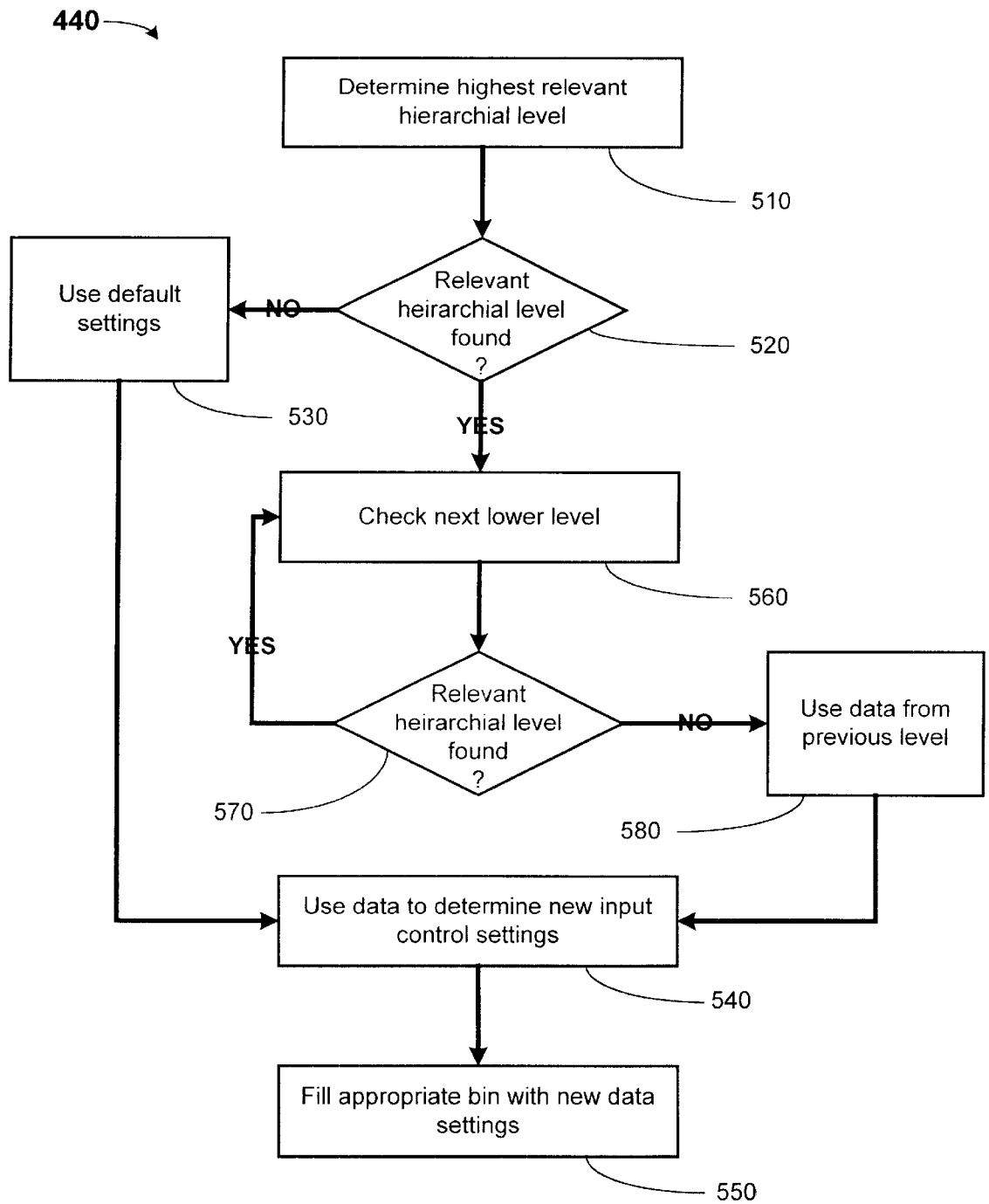
FIG. 5 illustrates a more detailed description of the step described in block 440 of FIG. 4.

Turning now to FIG. 5, the highest relevant hierarchical level that relates to the present process step is determined, as described in block 510. In other words, the control thread that represents the hierarchical level closest to the top hierarchical level that is related to the present process step is found. A determination is then made whether a control thread from a relevant hierarchical level is found, as described in block 520 of FIG. 5. When a hierarchical level that contains a control thread that can be utilized for the present process is not found, then default settings are used, as described in block 530 of FIG. 5. The default settings are then used to determine the new input control settings for the present process step, as described in block 540 of FIG. 5. This new input control setting is then filled into an appropriate bin in a hierarchical level, as described in block 550 of FIG. 5.

Referring to block 520, when a relevant hierarchical level that contains a control thread that can be utilized for the present process is found, the next lower hierarchical level is checked, as described in block 560 of FIG. 5. In other words, when a control thread in a hierarchical level is found, the next lower hierarchical level is checked to determine if it contains a control thread that is more closely, or specifically, related to the present process. A determination is then made whether the lower hierarchical level contains a relevant control thread, as described in block 570. When a determination is made that a relevant control thread is found in a lower hierarchical level, the next lower hierarchical level is checked. This process is repeated until the lowest hierarchical level that contains a relevant control thread for the current process is found.

When a determination is made that the lowest hierarchical level checked does not contain relevant control thread data, the control thread data from the previous hierarchical level is used to control the present process step, as described in block 580 of FIG. 5. In other words, data from the lowest relevant hierarchical level, which contains the most specific control thread for the present process, is used. The data from the lowest relevant hierarchical level is used to generate the new control settings for the present process step, as described in block 540. This new input control setting is then filled into an appropriate bin in a hierarchical level, as described in block 550 of FIG. 5. This completes the steps of determining(y settings and filling in appropriate bins in hierarchical bins, as described in block 440 of FIG. 4. The new control inputs are used for the next run of semiconductor device processing sequence, as described in block 450 of FIG. 4.

Figure 6:
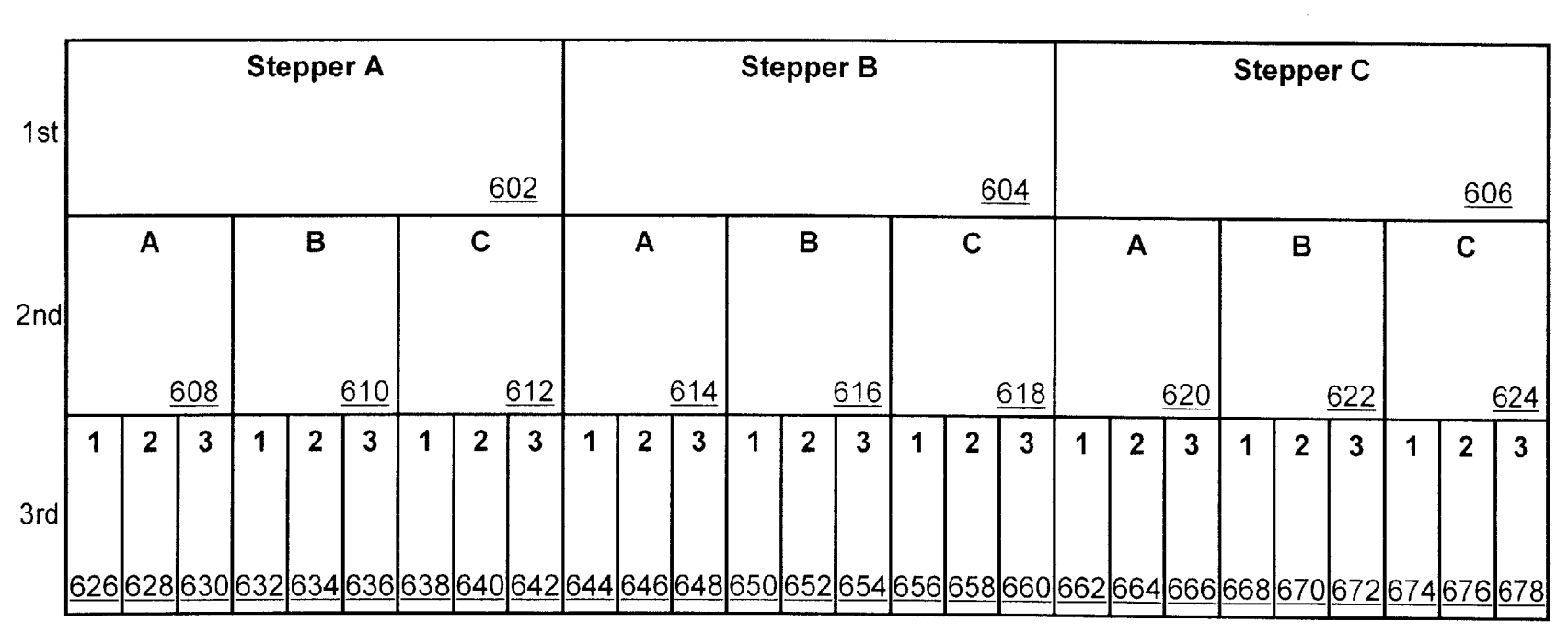

A graphical depiction of one embodiment of the hierarchical levels described in the present invention is illustrated in FIG. 6. In one embodiment, control threads used by a process controller, such as the overlay controller, contain three discrete context values that determine the control inputs. The stepper being used in a current process will generally have the highest impact on process performance, and therefore will constitute the first hierarchical level. Blocks (or bins) 602, 604, and 606 of FIG. 6 are part of the first hierarchical level. Block 602 contains the control thread data for a stepper A. Block 604 contains the control thread data for a stepper B. Block 606 contains the control thread data for a stepper C.

The second hierarchical level will generally have the next highest impact of process performance, and therefore will constitute the second hierarchical level. Blocks 608, 610, and 612 contain data for previous steppers A, B, and C, respectively, which have similar processes as that of the current stepper A in block 602. Blocks 614, 616, and 618 contain data for previous steppers A, B, and C, respectively, which have similar processes as that of the current stepper B in block 604. Blocks 620, 622, and 624 contain data for previous steppers A, B, and C, respectively, which have similar processes as that of the current stepper C in block 606. The third hierarchical level represents the current operation, which has the least impact of identified hierarchies. Blocks 626, 628, and 630 represent a process 1, a process 2, and a process 3, respectively, which are performed on a previous stepper A in block 608. Blocks 632, 634, and 636 represent a process 1, a process 2, and a process 3, respectively, which are performed on a previous stepper A in block 610. Blocks 638, 640, and 642 represent a process 1, a process 2, and a process 3, respectively, which are performed on a previous stepper A in block 612. Blocks 644, 646, and 648, represent a process 1, a process 2, and a process 3, respectively, which are performed on a previous stepper B in block 614. Blocks 650, 652, and 654 represent a process 1, a process 2, and a process 3, respectively, which are performed on a previous stepper B in block 616. Blocks 656, 658, and 660 represent a process 1, a process 2, and a process 3, respectively, which are performed on a previous stepper B in block 618. Blocks 662, 664, and 666 represent a process 1, a process 2, and a process 3, respectively, which are performed on a previous stepper C in block 620. Blocks 668, 670, and 672, represent a process 1, a process 2, and a process 3, respectively, which are performed on a previous stepper C in block 622. Blocks 674, 676, and 678 represent a process 1, a process 2, and a process 3, respectively, which are performed on a previous stepper C in block 624.

A series of examples are provided to illustrate the usage and filling in of control threads using the hierarchical method taught by the present invention. Turning now to FIG. 7, an illustration of an example of the implementation of the hierarchical system based upon the results of processing a first semiconductor lot is depicted. Block 602 in the first hierarchical level, block 608 in the second hierarchical level, and block 626 in the third hierarchical level are shaded indicating that these blocks (or bins) contain relevant control thread data for a current process. A first semiconductor lot is processed on stepper A, represented by block 602 in the first hierarchical level being shaded. The first semiconductor lot was previously processed on stepper A, represented by block 608 in the second hierarchical level being shaded. Furthermore, process 1 is implemented on the first semiconductor lot, represented by block 626 in the third hierarchical level being shaded. Information from processing the first semiconductor lot is used to fill in the related bins in the hierarchy represented by the shaded blocks 602, 608, and 626. A process controller can then extract data from the bins in the hierarchical levels to process other related semiconductor lots.

Figure 8:
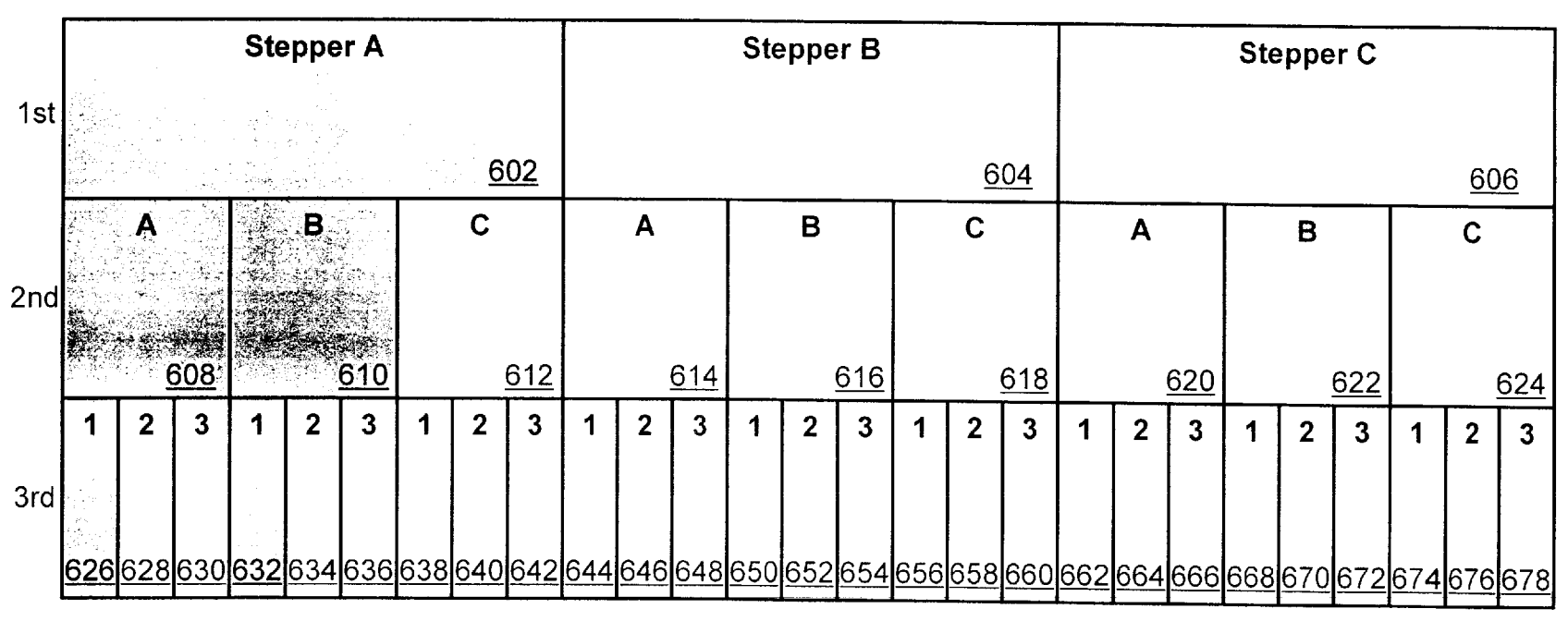

Turning now to FIG. 8, an illustration of the effect on the hierarchical system based on a second processing run of a semiconductor lot is depicted. A second semiconductor lot is processed on stepper A, represented by the shading of block 602 in the first hierarchical level. The second semiconductor lot was previously processed on stepper B, represented by the shading of block 610 in the second hierarchical level. Furthermore, process 1 is implemented on the second semiconductor lot, represented by the shading of block 632 in the third hierarchical level. Only block 602 in the first hierarchical level contains the data needed for the present semiconductor run, therefore only the first level information is used. The shaded blocks in FIG. 8 represent the control thread data that are available as a result of processing the first and second semiconductor lots.

Turning now to FIG. 9, an illustration of the effect on the hierarchical system based on a third processing run of a semiconductor lot is depicted. A third semiconductor lot is processed on stepper A, represented by the shading of block 602 in the first hierarchical level. The third semiconductor lot was previously processed on stepper B, represented by the shading of block 610 in the second hierarchical level. Furthermore, process 2 is implemented on the third semiconductor lot, represented by the shading of block 634 in the third hierarchical level. Both the first hierarchical level (block 602) and second hierarchical level (block 610) contain relevant data needed for the present semiconductor run, therefore the second hierarchical level, which contains more specific data, is used. The shaded blocks in FIG. 9 represent the control thread data that are available as a result of processing the first, second, and third semiconductor lots.

Figure 10:
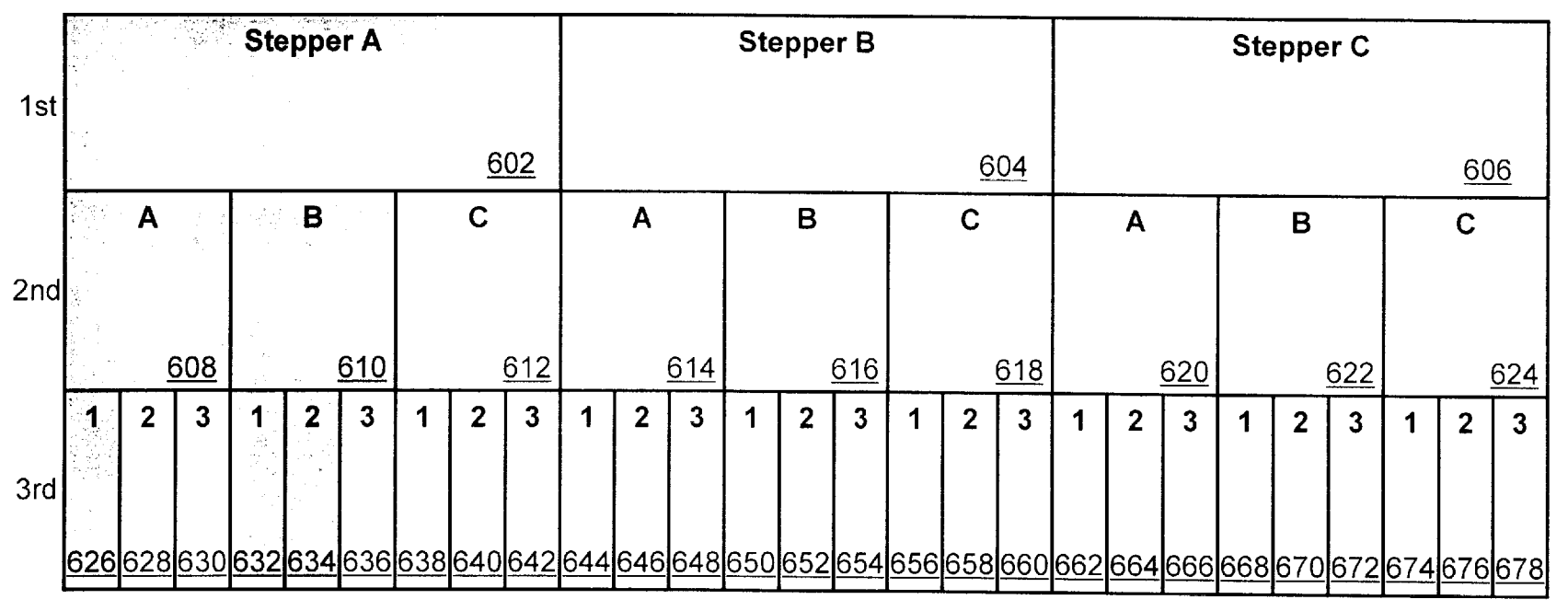

Turning now to FIG. 10, an illustration of the effect on the hierarchical system based on a fourth processing run of a semiconductor lot is depicted. A fourth semiconductor lot is processed on stepper A, represented by the shading of block 602 in the first hierarchical level. The fourth semiconductor lot was previously processed on stepper B, represented by the shading of block 610 in the second hierarchical level. Furthermore, process 2 is implemented on the fourth semiconductor lot, represented by the shading of block 634 in the third hierarchical level. All three hierarchical levels (blocks 602, 610, and 634) contain relevant data needed for the present semiconductor run, therefore the third (the lowest) hierarchical level, which contains data most specific to the present process, is used. The shaded blocks in FIG. 10 represent the control thread data that are available as a result of processing the first, second, third, and fourth semiconductor lots.

Turning now to FIG. 11, an illustration of the effect on the hierarchical system based on a fifth processing run of a semiconductor lot is depicted. A fifth semiconductor lot is processed on stepper B, represented by the shading of block 604 in the first hierarchical level. The fifth semiconductor lot was previously processed on stepper B, represented by the shading of block 616 in the second hierarchical level. Furthermore, process 2 is implemented on the fifth semiconductor lot, represented by the shading of block 652 in the third hierarchical level. None of the three hierarchical levels contain relevant data needed for the present semiconductor run, therefore default settings are used. The shaded blocks in FIG. 11 represent the control thread data that are available as a result of processing the first, second, third, fourth, and fifth semiconductor lots. A process controller can then extract data from the bins in the hierarchical levels to process other related semiconductor lots.

The aforementioned example illustrated the results of processing five semiconductor lots. The data gathered from the five processing runs provided control thread data that were filled into the bins (identified by the shaded blocks in FIG. 11) in the hierarchical levels. Generally, each bin in the hierarchical level will contain data only from the processing runs whose context matched that particular bin. Although higher levels may have more data, those data sets may not be specific to all of the context conditions for an individual lot. Therefore, the data from the lowest relevant hierarchical level is used, in conjunction with default data, to process a new semiconductor lot. Although only three hierarchical levels were illustrated in the previous example, many hierarchical levels can be created to organize control thread data. In one embodiment, a computer system 130 can be programmed to automatically select the most relevant hierarchical level and formulate proper control inputs. Furthermore, the computer system 130 can be programmed to update the proper hierarchical levels upon the completion of the processing of a semiconductor lot.

The principles taught by the present invention can be implemented in an Advanced Process Control (APC) framework. The APC is a preferred platform from which to implement the overlay control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the overlay controller. The control methods are generally defined and performed in these scripts. The development of these scripts can comprise a significant portion of the development of a control system.

In one embodiment, for the overlay control project, there are four separate scripts that perform all of the necessary tasks. There is one script each for the ASM stepper and the review station, a script to handle the actual data capture from the review station, and another subscript that contains common procedures that can be referenced by any of the other scripts. Examination of these scripts, and how they interact with the production flow, can reveal the actual control action enacted by the overlay control scheme taught by the present invention.

In one embodiment the overlay control procedure begins at the source/drain portion of the semiconductor device fabrication procedure. The ASM steppers are used to expose the photoresist, which in turn defines the active areas of the wafer. The overlay controller will treat this as the previous layer when it processes wafer lots through the poly gate steps, so some information is required from wafer lots run at this step. In one embodiment, before the semiconductor manufacturing tools are run, an APC script is called to initialize the machine. At this step, the script records the entity number of the semiconductor manufacturing tool and the wafer lot number. The entity number is then stored against the lot number in Data Store. The rest of the script, such as the APCData call and the Setup and StartMachine calls, are formulated with blank or dummy data in order to force the machine to use its default settings.

The subsequent time that semiconductor wafer lots enter the domain of the controller is generally during the poly gate portion of semiconductor device fabrication. This is the patterned level that is just above the source/drain layer. These two adjacent patterned layers are subject to overlay metrology, which enable the use of feedback control to correct errors in overlay. This is generally true for any two adjacent patterned layers that are followed by a review station metrology step. To enable control action, a control thread corresponding to the current semiconductor wafer lot is created from the process information.

The control thread for the overlay.control scheme depends upon the current stepper, current operation, the product code for the current lot, and the entity number at the previous patterned layer. The first three parameters are generally found in the context information that is passed to the script from the current stepper. The fourth parameter is generally stored when the lot is processed through the previous layer. Once all four parameters are defined, they are combined to form the control thread name; STP62_2037_6528FQ_STP64 is an example of a control thread name. The control thread name is also stored in correspondence to the wafer lot number in Data Store.

Once the lot is associated with a control thread name, the stepper settings for that control thread are generally retrieved from Data Store. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the overlay errors as the control input settings. It is preferred that the controllers use the default machine settings as the initial settings. By assuming some settings, the overlay errors can be related back to the control settings in order to facilitate feedback control.

Another possibility is that the settings are stored under the control thread name. In this case, one or more semiconductor wafer lots have been processed under the same control thread name as the current semiconductor wafer lot, and have also been measured for overlay error using the review stations. When this information exists, the control input signal settings are retrieved from Data Store. These settings are then downloaded to the ASM stepper via the APCData call.

Finally, the wafer lots are measured on the review stations after exposure on the steppers. The script begins with a number of APC commands to allow for the collection of data. The review station script then locks itself in place and activates a Data Available script. This script facilitates the actual transfer of the data from the review station to the APC framework. Once the transfer is completed, the script exits and unlocks the review station script. The interaction with the review station is then generally complete.

In one embodiment, after the data is collected, it is processed to generate an estimate of the current error in the control input signal settings. First, the data is passed to a compiled Matlab plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This includes replacing redundant data or removing older data. Once the data stack is adequately prepared, it is parsed into ascending time-ordered arrays that correspond to the error values. These arrays are fed into the EWMA plug-in along with an array of the parameters required for its execution. In one embodiment, the return from the plug-in is comprised of the six filtered error values.

The final step in the process is to calculate the new settings for the stepper. The previous settings for the control thread corresponding to the current wafer lot are retrieved from Data Store. This data is paired along with the current set of overlay errors. The new settings are calculated by calling a compiled Matlab plug-in. This application incorporates a number of inputs, performs calculations in a separate execution component, and returns a number of outputs to the main script. Generally, the inputs of the Matlab plug-in are the control input signal settings, the review station errors, an array of parameters that are necessary for the control algorithm, and a currently unused flag error. The outputs of the Matlab plug-in are the new controller settings, calculated in the plug-in according to the controller algorithm described above. A photolithography process engineer or a control engineer, who generally determines the actual form and extent of the control action, can set the parameters. They include the threshold values, maximum step sizes, controller weights, and target values. Once the new parameter settings are calculated, the script stores the setting in Data Store such that the steppers can retrieve them for the next wafer lot to be processed. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for controlling a manufacturing process using a hierarchical system, comprising:

processing a first lot of semiconductor devices using a first set of control input parameters;

storing said first set of control input parameters in one of a plurality of hierarchical levels, said first set of control input parameters being available for processing of a second lot of semiconductor devices;

acquiring process data from said processing of said first lot of semiconductor devices;

determining a second set of control input parameters for a subsequent lot of semiconductor devices based upon said acquired process data; and storing said second set of control input parameters in one of a plurality of hierarchical levels, said first and second sets of control input settings being available for processing of a third lot of semiconductor devices.

2. The method described in claim 1, wherein processing said lots of semiconductor devices based upon said sets of control input parameters further comprises processing semiconductor wafers.

3. The method described in claim 2, wherein processing semiconductor wafers further comprises using an exposure tool.

4. The method described in claim 3, wherein processing semiconductor wafers using said exposure tool further comprises using an advanced process control framework.

5. The method described in claim 1, wherein processing said lots of semiconductor devices based upon said sets of control input parameters further comprises processing semiconductor devices based upon control input parameters defined by a control thread.

6. The method described in claim 1, wherein processing said lots of semiconductor devices based upon said sets of control input parameters further comprises processing semiconductor tools based upon control input parameters that comprise an x-translation signal, a y-translation signal, an x-expansion wafer scale signal, a y-expansion wafer scale signal, a reticle magnification signal, and a reticle rotation signal.

7. The method described in claim 1, wherein storing said sets of control input parameters in one of a plurality of hierarchical levels further comprises storing said first set of control input parameters in a hierarchical level that is defined by a process tool type.

8. The method described in claim 1, wherein storing said sets of control input parameters in one of a plurality of hierarchical levels further comprises storing said first set of control input parameters in a hierarchical level that is defined by a particular lot of semiconductor wafers.

9. The method described in claim 1, wherein storing said sets of control input parameters in one of a plurality of hierarchical levels further comprises storing said first set of control input parameters in a hierarchical level that is defined by a particular manufacturing process.

10. The method described in claim 1, wherein acquiring process data from said processing of said first lot of semiconductor device s further comprises accessing metrology relating to the processing of said first lot of semiconductor devices.

11. The method described in claim 1, wherein determining a second set of control input parameters for a subsequent lot of semiconductor devices further comprises using data stored in said plurality of hierarchical levels to determine said second set of control input parameters.

12. The method described in claim 1, wherein determining a second set of control input parameters for a subsequent lot of semiconductor devices further comprises:

determining a lowest relevant hierarchical level;

using a set of default control parameters in response to a determination that said lowest relevant hierarchical level is not found;

acquiring data from said lowest relevant hierarchical level; and determining a set of new control input parameters using data acquired from said lowest relevant hierarchical level.

13. The method described in claim 12, wherein determining a lowest relevant hierarchical level further comprises determining a hierarchical level that contains data of a previous process that is similar to a current process.

14. An apparatus for controlling manufacturing processes using a hierarchical system, comprising:

means for processing a first lot of semiconductor devices using a first set of control input parameters;

means for storing said first set of control input parameters in one of a plurality of hierarchical levels, said first set of control input parameters being available for processing a second lot of semiconductor devices;

means for acquiring process data from said processing of said first lot of semiconductor devices;

means for determining a second set of control input parameters for a subsequent lot of semiconductor devices based upon said acquired process data; and means for storing said second set of control input parameters in one of a plurality of hierarchical levels, said first and second sets of control input settings being available for processing of a third lot of semiconductor devices.

15. A computer readable program storage device encoded with instructions that, when executed by a computer, performs a method for controlling manufacturing processes using a hierarchical system, comprising:

processing a first lot of semiconductor devices using a first set of control input parameters;

storing said first set of control input parameters in one of a plurality of hierarchical levels, said first set of control input parameters being available for processing of a second lot of semiconductor devices;

acquiring process data from said processing of said first lot of semiconductor devices;

determining a second set of control input parameters for a subsequent lot of semiconductor devices based upon said acquired process data; and storing said second set of control input parameters in one of a plurality of hierarchical levels, said first and second sets of control input settings being available for processing of a third lot of semiconductor devices.

16. The computer readable program storage device encoded with instructions that, when executed by a computer, performs the method described in claim 15, wherein processing said lots of semiconductor devices based upon said sets of control input parameters further comprises processing semiconductor wafers.

17. The computer readable program storage device encoded with instructions that, when executed by a computer, performs the method described in claim 16, wherein processing semiconductor wafers further comprises using an exposure tool.

18. The computer readable program storage device encoded with instructions that, when executed by a computer, performs the method described in claim 17, wherein processing semiconductor wafers using said exposure tool further comprises using an advanced process control framework.

19. The computer readable program storage device encoded with instructions that, when executed by a computer, performs the method described in claim 15, wherein processing said lots of semiconductor devices based upon said sets of control input parameters further comprises processing semiconductor devices based upon control input parameters defined by a control thread.

20. The computer readable program storage device encoded with instructions that, when executed by a computer, performs the method described in claim 15, wherein processing said lots of semiconductor devices based upon said sets of control input parameters further comprises processing semiconductor devices based upon control input parameters that comprise an x-translation signal, a y-translation signal, an x-expansion wafer scale signal, a y-expansion wafer scale signal, a reticle magnification signal, and a reticle rotation signal.

21. The computer readable program storage device encoded with instructions that, when executed by a computer, performs the method described in claim 15, wherein storing said sets of control input parameters in one of a plurality of hierarchical levels further comprises storing said first set of control input parameters in a hierarchical level that is defined by a process tool type.

22. The computer readable program storage device encoded with instructions that, when executed by a computer, performs the method described in claim 15, wherein storing said sets of control input parameters in one of a plurality of hierarchical levels further comprises storing said first set of control input parameters in a hierarchical level that is defined by a particular lot of semiconductor wafers.

23. The computer readable program storage device encoded with instructions that, when executed by a computer, performs the method described in claim 15, wherein storing said sets of control input parameters in one of a plurality of hierarchical levels further comprises storing said first set of control input parameters in a hierarchical level that is defined by a particular manufacturing process.

24. The computer readable program storage device encoded with instructions that, when executed by a computer, performs the method described in claim 15, wherein acquiring process data from said processing of said first lot of semiconductor devices further comprises accessing metrology relating to the processing of said first lot of semiconductor devices.

25. The computer readable program storage device encoded with instructions that, when executed by a computer, performs the method described in claim 15, wherein determining a second set of control input parameters for a subsequent lot of semiconductor devices further comprises using data stored in said plurality of hierarchical levels to determine said second set of control input parameters.

26. The computer readable program storage device encoded with instructions that, when executed by a computer, performs the method described in claim 15, wherein determining a second set of control input parameters for a subsequent lot of semiconductor devices further comprises:

determining a lowest relevant hierarchical level;

using a set of default control parameters in response to a determination that said lowest relevant hierarchical level is not found;

acquiring data from said lowest relevant hierarchical level; and determining a set of new control input parameters using data acquired from said lowest relevant hierarchical level.

27. The computer readable program storage device encoded with instructions that, when executed by a computer, performs the method described in claim 26, wherein determining a lowest relevant hierarchical level further comprises determining a hierarchical level that contains data of a previous process that is similar to a current process.

* * * * *

UNITED STATES PATENT AND TRADEMARK OFFICE
CERTIFICATE OF CORRECTION

PATENT NO. : 6,607,926 B1 Page 1 of 1
DATED : August 19, 2003
INVENTOR(S) : Anthony J. Toprac, William J. Campbell, Christopher A. Bode It is certified that error appears in the above-identified patent and that said Letters Patent is hereby corrected as shown below:

Column 1,
Line 18, replace "Todays" with -- Today's --.
Line 50, replace "settings" with -- settings, --.

Column 6,
Line 34, replace "stations" with -- settings, --.
Line 56, replace "calculated In" with -- calculated. In --.

Column 9,
Line 36, replace "determining(y" with -- determining --.

Column 12,
Line 60, replace "overlay.control" with -- overlay control --.

Column 13,
Line 9, replace "arc" with -- are --.

Column 15,
Line 18, replace "device s" with -- devices --.

Signed and Sealed this

Eleventh Day of November, 2003

JAMES E. ROGAN
*Director of the United States Patent and Trademark Office*